United States Patent
Casanova

(10) Patent No.: US 11,674,678 B2
(45) Date of Patent: Jun. 13, 2023

(54) APPARATUS WITH CHARGE DISSIPATION

(71) Applicant: SIGNIFY HOLDING B.V., Eindhoven (NL)

(72) Inventor: Maurice Lucien Eugene Casanova, Maastricht (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 153 days.

(21) Appl. No.: 17/418,126

(22) PCT Filed: Jan. 2, 2020

(86) PCT No.: PCT/EP2020/050013
§ 371 (c)(1),
(2) Date: Jun. 24, 2021

(87) PCT Pub. No.: WO2020/141192
PCT Pub. Date: Jul. 9, 2020

(65) Prior Publication Data
US 2022/0082237 A1 Mar. 17, 2022

(30) Foreign Application Priority Data
Jan. 3, 2019 (EP) ................................. 19150180

(51) Int. Cl.
| | |
|---|---|
| *H05K 1/00* | (2006.01) |
| *F21V 23/00* | (2015.01) |
| *H05K 1/02* | (2006.01) |
| *H05K 1/14* | (2006.01) |
| *F21Y 115/10* | (2016.01) |

(52) U.S. Cl.
CPC ........... *F21V 23/006* (2013.01); *H05K 1/026* (2013.01); *H05K 1/0259* (2013.01); *H05K 1/142* (2013.01); *F21Y 2115/10* (2016.08)

(58) Field of Classification Search
CPC .... F21V 23/006; H05K 1/0259; H05K 1/026; H05K 1/142; F21Y 2115/10
See application file for complete search history.

(56) References Cited

U.S. PATENT DOCUMENTS

| | | | |
|---|---|---|---|
| 5,880,937 A | 3/1999 | Schadhauser et al. | |
| 7,433,167 B2 * | 10/2008 | Schediwy | G06F 3/03547 |
| | | | 361/112 |
| 9,408,294 B2 * | 8/2016 | Leone | H05K 1/0201 |
| 2002/0001160 A1 | 1/2002 | Berberich | |

(Continued)

FOREIGN PATENT DOCUMENTS

| | | |
|---|---|---|
| EP | 0785708 B1 | 6/1999 |
| EP | 1148602 B1 | 11/2003 |

(Continued)

*Primary Examiner* — Pete T Lee

(57) ABSTRACT

An electrical apparatus has an external conductive housing. A printed circuit board is provided (separate to a main circuit board of the apparatus) within a PCB housing. The printed circuit board is mechanically and electrically connected to the external housing and has an arc gap between a first contact which connects electrically to the external housing and a second contact which connects electrically to a power supply terminal. Thus, a dedicated circuit is used to perform a discharge function so that the housing and main circuit board do not need to be redesigned.

15 Claims, 5 Drawing Sheets

(56) References Cited

U.S. PATENT DOCUMENTS

| | | | |
|---|---|---|---|
| 2008/0239600 A1* | 10/2008 | Hsu | H05K 9/0067 |
| | | | 361/56 |
| 2009/0251843 A1 | 10/2009 | Hironaka | |
| 2014/0368124 A1 | 12/2014 | Lai et al. | |
| 2017/0352994 A1 | 12/2017 | Casanova et al. | |

FOREIGN PATENT DOCUMENTS

| KR | 20120092843 A | 8/2012 |
|---|---|---|
| WO | 2014029772 A1 | 2/2014 |
| WO | 2015145367 A1 | 10/2015 |

\* cited by examiner

APPARATUS WITH CHARGE DISSIPATION

CROSS-REFERENCE TO PRIOR APPLICATIONS

This application is the U.S. National Phase application under 35 U.S.C. § 371 of International Application No. PCT/EP2020/050013, filed on Jan. 2, 2020, which claims the benefit of European Patent Application No. 19150180.8, filed on Jan. 3, 2019. These applications are hereby incorporated by reference herein.

FIELD OF THE INVENTION

The present invention relates to an apparatus which provides a path for dissipation for excess charges. It relates in particular to outdoor apparatus, such as luminaires.

BACKGROUND OF THE INVENTION

The design of outdoor electrical apparatus, such as outdoor luminaires, e.g. street lighting, traffic lights, and so on, is typically mandated by standards to ensure that such luminaires comply with the applicable health and safety regulations. Such luminaires may be subdivided into the following classes.

Class I luminaires are electrically insulated and provided with a connection to earth in order to protect exposed metal parts that become live, e.g. in case of electrical insulation failure.

Class II luminaires are designed such that protection against electric shock does not rely on basic electrical insulation only.

Class III luminaires provide protection against electric shock which relies on the so-called supply at Safety Extra-Low Voltage (SELV) in which voltages above SELV (maximum 50V AC RMS) are not generated.

Where luminaires are mounted on electrically insulating structures, e.g. wooden poles, insulating mounting wires or the like, connection to ground may not be feasible, such that Class II luminaires often are used in such circumstances, e.g. when replacing a traditional luminaire with a solid state lighting, e.g. LED-based, luminaire. This may be performed for example to reduce maintenance needs for the luminaire owing to the excellent lifetime characteristics of solid state lighting-based luminaires as well as to reduce energy costs owing to the excellent energy consumption characteristics of such luminaires.

Unfortunately, many luminaires (and in particular Class II luminaires) are particularly vulnerable to charge accumulation, e.g. caused by an unforeseen electrical discharge such as a lightning strike or charges induced by electric fields between clouds and the ground (known as the mirror charge effect). These charge surges can negatively impact the lifetime of the active circuit components, e.g. one or more driver circuits and/or one or more light engines, of the luminaire, which may become damaged by such surges. Repairs or replacement of such components may then become required, which is undesirable and can be particularly cumbersome if the luminaire is mounted in a difficult to access location. Such surges for example may occur due to the presence of parasitic capacitances in the luminaire. For instance, a parasitic capacitance may exist between copper tracks and the aluminum substrate of a metal core printed circuit board (MCPCB), which can provide an undesired electrical path in case of a surge event.

Therefore, there exists a need for some form of surge protection in such luminaires. However, the widely applicable luminaire standard IEC 60598-1 prevents the use of overvoltage protection devices inside a luminaire to ensure common mode protection. KR 2012/0092843 A discloses a substrate for an LED lighting device having an electromagnetic shielding function to prevent the damage of an inner lead of LEDs by discharging and bypassing electromagnetic energy through a ground pattern. This however cannot be used in Class II luminaires due to the absent ground connection in such luminaires.

One possible solution for surge protection of the electrical components in luminaires such as Class II luminaires is to deploy an electrically insulating material around the electrical components separating these components from the metal housing of such a luminaire. However, the thickness of such an electrically insulating envelope required to achieve the desired electrical insulation compromises the heat transfer from the heatsink coupled to the MCPCB to the outside world, thereby reducing the lifetime of the LEDs on the MCPCB due to thermal stress.

SUMMARY OF THE INVENTION

The invention is defined by the claims.

According to examples in accordance with an aspect of the invention, there is provided an electrical apparatus comprising:

an external housing including an electrically conductive portion;

at least first and second power supply terminals for connection to an external source of power;

a first printed circuit board in the external housing which carries a circuit;

an electrically conductive screening layer attached to or integrated within the first printed circuit board, wherein the conductive screening layer is insulated from the external housing and from the circuit;

a second printed circuit board, separate to the first printed circuit board;

a PCB housing around the second printed circuit board and within the external housing, wherein:

the second printed circuit board is mechanically connected to the external housing and electrically coupled to the electrically conductive portion of the external housing;

the second printed circuit board comprises an arc gap between a first contact which connects electrically to the electrically conductive portion of the external housing and a second contact which connects electrically to one of the first and second power supply terminals.

This design makes use of a dedicated printed circuit board to provide a discharge path for excess charge. This provides a discharge path of mirror charges on the external housing. This avoids the need to redesign the housing, so that the second printed circuit board may be added as a retrofit or improvement to existing apparatus designs. A discharge path is provided to one or both of the power supply terminals, but there is no direct connection so that the external housing remains isolated from the power supply terminals.

The second printed circuit board for example comprises a slot, with the first and second contacts on opposing sides of the slot. The slot then functions as the arc gap.

The second printed circuit board may comprise a second arc gap between the first contact and a third contact which connects electrically to the other of the first and second power supply terminals. For this purpose, the second printed circuit board may comprise a second slot, with the first and third contacts on opposing sides of the second slot.

Thus, discharge paths may be provided to both power supply terminals.

The contacts may each comprise a toothed edge, wherein toothed edges face each other across a slot. This promotes the generation of an arc across the gap in response to the build up of charge.

The first printed circuit board may comprise a metal core printed circuit board, and the conductive screening layer comprises the metal core of the printed circuit board. This provides an integrated solution.

The second printed circuit board may further comprise a first arrangement of one or more bleeder resistors connected between the electrically conductive portion of the external housing and one of the first and second power supply terminals. These are used to avoid static charging of the external housing with respect to the power supply terminals. They provide a desired limitation to touch current.

The second printed circuit board may further comprise a second arrangement of one or more bleeder resistors connected between the electrically conductive portion of the external housing and the other of the first and second power supply terminals. Thus, there is a current limitation path to both power supply terminals. For the avoidance of doubt, for a multi-phase system, there may be more than two power supply terminals.

The second printed circuit board may carry a first Y-capacitor connected electrically between the conductive screening layer and one of the first and second power supply terminals.

This enables a coupling of the shielded screen with equipotential bonding, even when there is no ground or protective earth terminal. A direct galvanic coupling is avoided. The capacitive coupling protects the circuit against electromagnetic fields, in particular fast transients containing high frequency disturbances.

The second printed circuit board may further carry a second Y-capacitor connected electrically between the conductive screening layer and the other of the first and second power supply terminals. Thus, there is capacitive coupling to both power supply terminals.

The second printed circuit board may further comprise an insulated metal pad extending on opposite sides of the or each arc gap. This is used for electromagnetic field shaping to assist the arc generation.

Each insulated metal pad may be electrically floating or electrically connected to the electrically conductive portion of the external housing or connected to the electrically conductive portion of the external housing through a capacitor.

The PCB housing preferably provides double or reinforced insulation, as protection for the live parts inside.

The apparatus may comprise a luminaire, and the circuit then comprises a light source circuit. The apparatus may then comprise a lighting driver in the external housing, which is separate to the first and second printed circuit boards.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
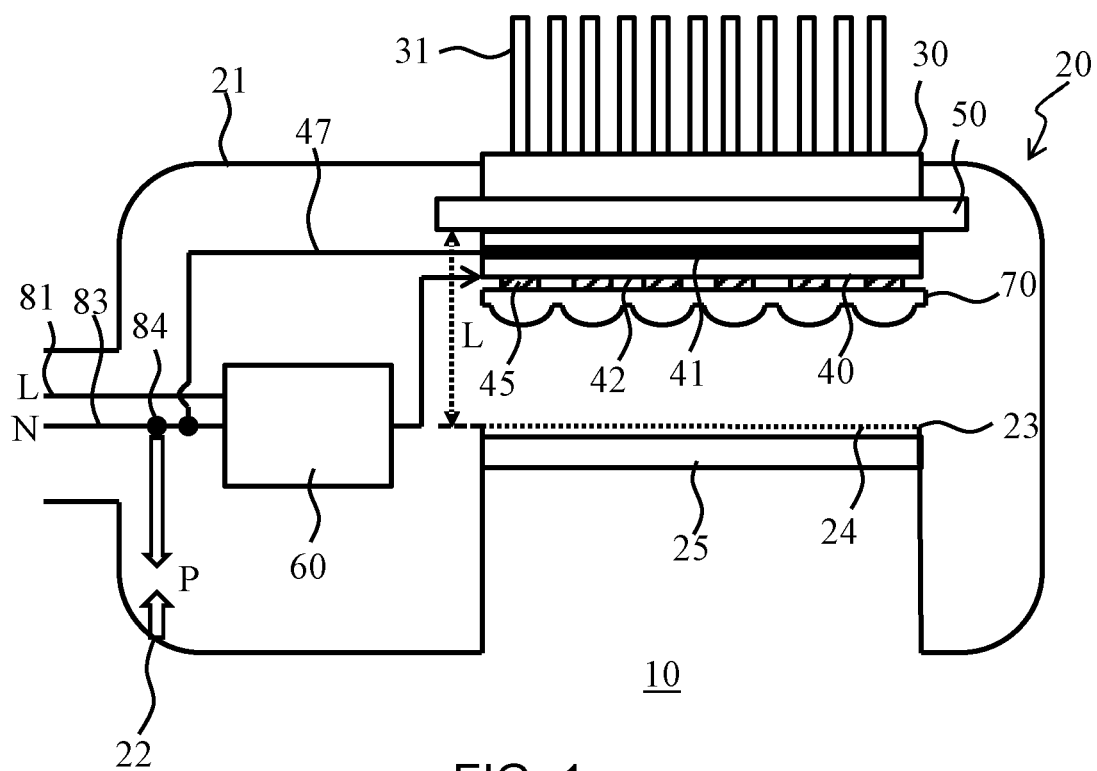
FIG. 1 schematically depicts a cross-sectional view of a luminaire which has been proposed by the applicant.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides an electrical apparatus having an external conductive housing. A printed circuit board is provided (separate to a main circuit board of the apparatus) within a PCB housing. The printed circuit board is mechanically and electrically connected to the external housing and has an arc gap between a first contact which connects electrically to the external housing and a second contact which connects electrically to a power supply terminal. Thus, a dedicated circuit is used to perform a discharge function so that the housing and main circuit board do not need to be redesigned.

FIG. 1 discloses schematically depicts a cross-sectional view of a luminaire 10 which has been proposed by the applicant.

The luminaire 10 comprises a housing 20 that is at least partially made of a metal, i.e. comprises an electrically conductive portion 21, for example formed of steel, aluminum or iron. This conductive portion (at least) may be considered to define the chassis of the luminaire. The housing 20 at least partially defines an inner chamber of the luminaire 10 in which an electrical component arrangement, i.e. an arrangement of active electrical components, is housed.

The electrical component arrangement typically at least comprises a printed circuit board (PCB) 40 (or equivalent carrier) having a first major surface 42 carrying at least one light engine 45 for the generation of light to be emitted by the luminaire 10. The at least one light engine 45 comprises one or more LEDs spatially distributed across the first major surface 42 of the PCB 40, with each light engine 45 comprising one or more LEDs, e.g. a cluster of LEDs per individual light engine 45. Any suitable type of LEDs may be used for this purpose. It should furthermore be understood that the LEDs are not necessarily identical; it is for example equally feasible that the one or more light engines 45 comprise different types of LEDs, e.g. LEDs producing a luminous output having different spectral compositions such as different colored luminous outputs or white light luminous outputs having different color temperatures, in which case such a different LEDs may be individually controllable to control the spectral composition of the luminous output of the luminaire 10.

An optical structure such as a lens plate 70 may be mounted over the first major surface 42 of the PCB 40 to shape the luminous output of the at least one light engine 45 on this surface, as is well-known per se. Such a lens plate 70 may be made of any suitable material, e.g. an optical grade polymer such as polycarbonate, polyethylene terephthalate, poly (methyl methacrylate) and so on, glass, etcetera, and may implement any suitable lens function. Such a lens plate 70 in example embodiments may be used to convert a Lambertian luminous distribution produced by one or more LEDs into a different luminous distribution such as a Gaussian luminous distribution although it will be understood by the skilled person that such a lens plate may implement a virtually endless number of different optical functions including optical functions in which a non-symmetrical luminous distribution is produced to generate different luminous intensities in different regions illuminated by the luminaire 10. This may for example may be required in outdoor applications such as street lighting where a road surface may be illuminated in a different manner than a pavement or other pedestrian region.

The circuitry typically further comprises a driver 60 arranged to control the at least one light engine 45 on the PCB 40. Such a controller arrangement may comprise multiple drivers as will be readily understood by the skilled person and may further comprise a wireless communication module or the like to receive wireless control instructions, e.g. from a remote controller, for controlling the luminous output of the luminaire 10, in which case the driver 60 (or multiple drivers) are typically responsive to the wireless communication module.

The driver 60 is connected to a set of electrical conductors 81, 83, for connecting the driver (and other parts of the electrical component arrangement) to an external (mains) power supply including a first electrical conductor 81 for connecting to the live terminal L of a mains power supply and a second electrical conductor 83 for connecting to the neutral terminal N of a mains power supply.

In the case of Class II luminaires there is no ground connection.

The electrical conductors 81, 83 may take any suitable shape, e.g. pins, sockets, clips, solder pads, conductive tracks and so on, or any combination thereof.

The luminaire 10 further comprises a conductive screening layer 41, which typically is made of an electrically conductive material, e.g. a metal, metal alloy, a conductive coating or the like, and which is arranged to shield the PCB 40 and the at the least one light engine 45 mounted thereon from being exposed to a common mode surge phenomenon such as a lightning strike hitting the luminaire 10 or the mirror charge effect described above.

The conductive screening layer 41 may be the metal core, e.g. an aluminum core, of the PCB 40 in case of the PCB 40 being a metal core PCB (MCPCB) or alternatively may be arranged on the PCB 40, e.g. as a layer substantially or entirely covering a major surface of the carrier.

In an embodiment, the conductive screening layer 41 is connected to the second electrical conductor 83 through an electrically conductive connection 47 that bypasses the active circuit components, e.g. the driver 60, of the electrical component arrangement. In this manner, the conductive screening layer 41 is connected to the neutral terminal N of the mains supply when the luminaire 10 is connected to mains. During an electrical surge event, the bypass connection 47 ensures that the electrical charge collected by the conductive screening layer 41 substantially bypasses the active circuit components such as the driver 60, thereby protecting the active circuit components from breakdown or damage. In other words, the conductive screening layer 41 provides equipotential bonding between the conductive portion 21 of the housing 20 and the mains supply, thus shielding the active circuit components within the housing 20 from surge events.

Although this principle may be applied to any type of luminaire 10 comprising one or more active circuit components, this principle is particularly advantageous in luminaires 10 comprising one or more solid state lighting elements, e.g. LEDs, as their light engines 45, as such light engines are particularly vulnerable to exposure to the short high-energy impulses associated with surge phenomena. It will furthermore be understood that such a bypass connection 47 to the neutral terminal of the mains power supply applies particularly to Class II luminaires 10.

This design further provides an implementation of a discharge area, which may be described as a weakest spot. In particular, there is a defined location 22 within the conductive portion 21 of the housing 20 at which point the conductive portion 21 of the housing 20 has the smallest distance between the conductive portion 21 of the housing 20 and a point 84 on the second electrical conductor 83 or between the conductive screening layer 41 and the defined location 22, with all other points or locations of the conductive portion 21 exhibiting a greater distance to this point 84 or to the conductive screening layer 41. This refers to any distance through the luminaire 10 in which air is the dielectric medium between such a location on the conductive portion 21 of the housing 20 and the point 84 or the conductive screening layer 41. This minimal distance defines a pinch point P that creates an arc discharge path between the conductive portion 21 of the housing 20 and the point 84 (or conductive screening layer 41) such that upon the conductive portion 21 or the conductive screening layer 41 being subjected to a sudden electrical surge, the associated electrical charge is transferred from the conductive portion 21 to the conductive screening layer 41 (or vice versa) across the pinch point P. In this manner, the conductive screening layer 41 including the pinch point P acts as a lightning rod for collecting the electrical charge from the conductive portion 21 of the housing 20.

The pinch point P is located within a part of the housing in which the pinch point P does not interfere with active components, optical components and/or plastics components of the luminaire 10 such that any plasma, e.g. metal vapor, that is generated during an arc discharge event across the pinch point P does not significantly contaminate such components.

The luminaire 10 further comprises a heatsink 30 within the conductive portion 21 of the housing 20 thermally coupled to the PCB 40 in order to provide thermal management (cooling) of the at least one light engine 45 mounted on the first major surface 42 of the PCB 40. The heatsink 30 may form an integral part of the conductive portion 21 of the housing 20 although in alternative designs the heatsink 30 may be a discrete component mounted in the conductive portion 21 of the housing 20, in which case the conductive portion 21 of the housing 20 may comprise a recess or the like in which the heatsink 30 is mounted in any suitable manner. At least a portion 31 of the heatsink 30, e.g. the cooling fins of the heatsink 30, extend beyond the conductive portion 21 of the housing 20 in a direction away from the PCB 40, i.e. stands proud of the conductive portion 21 to provide effective cooling of the at least one light engine 45 on the PCB 40.

The heatsink 30 is typically made of a metal in order to ensure good thermal conductivity of the heatsink 30. Consequently, the PCB 40 needs to be protected from common mode surge events to which the conductive portion 21 including the heatsink 30 are exposed. For this reason, an insulating layer 50 is located in between the heatsink 30 and the PCB 40. The PCB 40 and, if present, the lens plate 70, are affixed to the heatsink 30 or an adjacent region of the conductive portion 21 of the housing 20 by at least one electrically insulating fixing arrangement extending through the PCB 40 (and the lens plate 70 if present) as well as through the electrically insulating layer 50. The at least one electrically insulating fixing arrangement ensures that when the conductive portion 21 of the housing 20 such as the heatsink 30 is exposed to a common mode surge event, this surge cannot travel through the fixing arrangement and reach the PCB 40 in this manner.

The conductive portion 21 of the housing 20 may substantially envelop the electrical component arrangement within the housing 20, i.e. the housing 20 may be substantially formed by the conductive portion 21. A rim 23 of the conductive portion 21 defines the light exit aperture 24 in the housing 20 opposite the first major surface 42 of the PCB 40 such that the light generated by the at least one light engine 45 on the PCB 40 can exit the luminaire 10 through the aperture 24.

An optically transmissive plate 25 may be mounted in the aperture 24 in order to prevent access to the internals of the luminaire 10 through the aperture 24. Such an optically transmissive plate 25 may be a transparent plate made of any suitable optically transparent material such as an optically transparent polymer or glass, or alternatively may implement an optical function such as a lens function, a diffuser function, and so on. Where the optically transmissive plate 25 implements a lens function, such a lens function may be combined with the lens plate 70 or alternatively the lens plate 70 may be omitted from the luminaire 10. The optically transmissive plate 25 may be mounted to the rim 23 of the conductive portion 21 in any suitable manner, e.g. using a rubber seal or the like to weatherproof the aperture 24.

This design implements a controlled discharge arc. The discharge to be provided is in particular created by the electric field between clouds and the ground, namely the mirror charge effect described above. Thus, a discharge path is needed not only for protecting against a direct lightning strike or for galvanic coupling causing an overvoltage due to common impedances carrying part of the lightening discharge current. At the moment of a lightning strike, this electric field will disappear rapidly.

The mirror charge on the housing of the luminaire will create high voltages with respect to ground. Because the housing of the luminaire is not earthed, the mains lines are the only paths available.

The design above is based on creating a direct path around the LEDs and electronics. It prevents that currents will pass via vulnerable electronic components damaging them. However, luminaire standards do not require common mode surge testing from Class II luminaires. As a result, the mirror charge effect causes the majority of failures on Class II LED outdoor luminaires.

The approach described above is based on implementing a weakest spot in the form of a mechanical construction which is part of the luminaire. This requires a redesign of the luminaire housing so is not feasible for existing luminaires as the molds must be changed.

This invention is a based on the use of an additional PCB for the discharge function, and not the PCB of the LED module. Furthermore, it avoids the direct connection 47 between conductive screening layer and the neutral line, so that it becomes suitable for situations where the conductive screening later may be touched.

The use of the LED module for providing a discharge arc is not feasible as it is too close to the optics. A discharge arc will therefore cause degradation of the optics. It is also desirable not to make use of the PCB of the driver either. This would also require a significant redesign of the driver architecture. The hot gasses and plasma during a discharge arc event could also damage the driver.

The invention may be applied to the design of FIG. 1, then avoiding the need for the mechanical pinch point P and avoiding the direct electrical connection made to the conductive screening layer 41.

Figure 2:
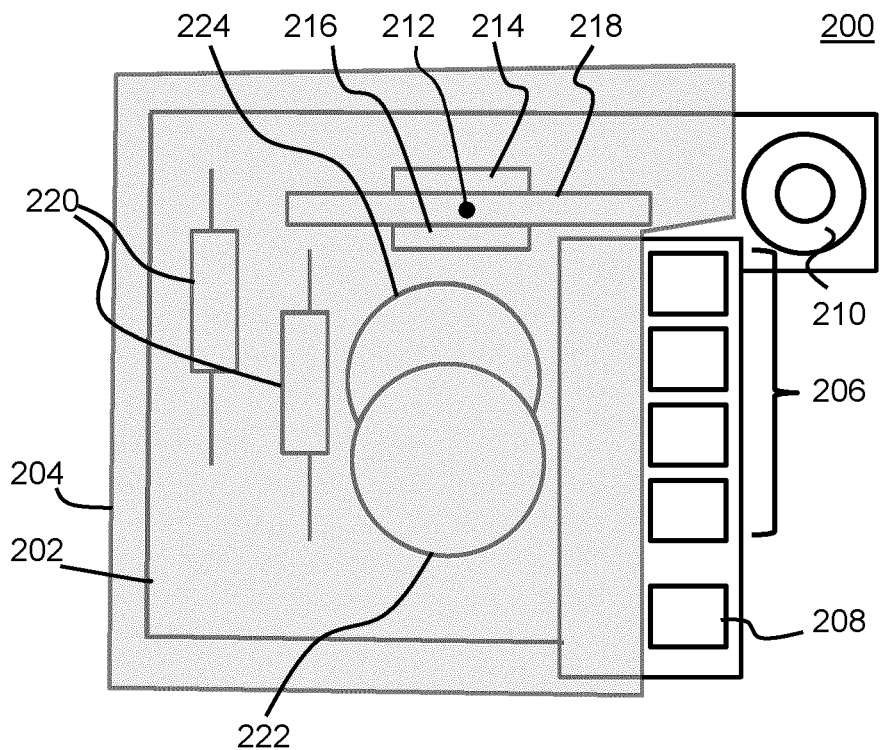
FIG. 2 shows an additional (second) PCB arrangement.

FIG. 2 shows the additional PCB arrangement 200 for providing the charge dissipation function. It is described as the "second" PCB arrangement since it is additional to a main PCB of the apparatus, e.g. the lighting circuit PCB in the case of a luminaire.

This second PCB is for example spaced from the main PCB of the apparatus, so that an arc which is deliberately allowed to form within the second PCB does not have an impact on the operation of the main PCB. There may for example be a non-zero minimum separation distance between them, for example at least 1cm, or at least 4 cm or even at least 5 cm.

It comprises a circuit board 202 and a PCB housing 204. It has a connector bank 206 for connecting to and distributing the live and neutral lines (81, 83 in FIG. 1) and a connector 208 for connection to the conductive screening layer 41.

For a luminaire, the housing 204 should comply with all standards of auxiliary equipment for lighting. It preferably provides reinforced or double insulation as there are live parts inside. Beside that, metal deposits due to arcing may not reduce insulation properties. The housing 204 should not be affected by the hot gasses created by the arcing. Finally, the pressure resulting during arcing should not damage the housing. For this purpose, a pressure release mechanism may be provided, so that the so-called 'cheese cloth paper test' is passed. This is a fire safety test.

A fixation 210 is provided for mechanically connecting the PCB to the external housing and for electrically coupling to the conductive portion 21 of the external housing. It comprises a fixing hole with an annular conduction pad around the fixing hole.

The fixation 210 projects from one side to the outside of the housing 204 and provides a mechanical fixation to the external housing and a low impedance electrical connection. The housing 204 is fixed to the PCB 202. For mechanical reasons, additional fixing points can be created between the luminaire external housing and the PCB housing 204.

An arc gap 212 is provided between a first contact 214 which connects electrically to the conductive portion 21 of the external housing and a second contact 216 which connects electrically to one of the first and second power supply terminals. A dedicated printed circuit board is thus used to provide a discharge path for excess charge, in particular mirror charges on the external housing. The arc gap 212 is implemented by a slot 218 in the PCB, with the first and second contacts 214, 216 on opposing sides of the slot.

There may also be a second arc gap and a second slot between the first contact 214 and a third contact which connects electrically to the other of the first and second power supply terminals. Thus, discharge paths may be provided to both power supply terminals.

The second printed circuit board 202 is also shown schematically with an arrangement 220 of one or more bleeder resistors. This arrangement is connected between the conductive portion 21 of the external housing and one or both of the first and second power supply terminals. These are used to avoid static charging of the external housing with respect to the power supply terminals. They provide a desired limitation to a touch current.

FIG. 2 also shows that the second printed circuit board 202 also carries a first Y-capacitor 222 (electrically between the conductive screening layer and one of the first and second power supply terminals) and a second Y-capacitor 224 (electrically between the conductive screening layer and the other of the first and second power supply terminals). Thus, in this example there is capacitive coupling to both power supply terminals. Multiple Y-capacitors can be placed in series to withstand higher voltages. Parallel Y-capacitor strings can be connected to one or more active conductors of the power supply.

This enables a coupling of the shielded screen with equipotential bonding, even when there is no ground or protective earth terminal.

It also provides protection in the event that a user touches the conductive screening layer, for example if the glass is broken or during service work. For example, the touch current is limited to 700 μA.

A standard conducting screen is normally directly coupled to ground or to the ground of the source of the disturbances. In many cases this would be protective earth. A floating screen will not be effective in most cases or may even worsen EMI (Electro Magnetic Interference) issues. In Class II luminaires, there is no ground or protective earth present so that the only reference is to live and/or neutral of the power grid. If the screen can be touched, a direct galvanic coupling to active conductors (phases or neutral) is not allowed as in FIG. 1.

The capacitive coupling described above thus protects the LEDs against electromagnetic fields during atmospheric discharges in the vicinity of an outdoor lighting installation. A lightning strike does not need to hit the luminaire itself or the cabling and infrastructure related to the outdoor lighting installation. The fields quickly disappear during a discharge (lightning strike). For that reason, fast transients are present mainly containing high frequency disturbances. Capacitors have a low impedance for this frequency spectrum.

The conductive screen can be touched in two cases. In case the glass is broken, the LED PCB can be touched. This also means that the metal core can be touched. When the luminaire is powered up during service, the casing may also be open. If closed, no electric parts are accessible for measurements required during servicing. The luminaire needs to be safe in this condition as well.

The safety standard for luminaires states that the touch current should be less than 700 μA peak. under nominal operating conditions. This means there is a minimum impedance required. This impedance is 465 kΩ for a 230V AC grid at 50 Hz. In practice this is 6.8 nF. The value is different for other nominal voltages and frequencies. The value will be selected as close as possible to the maximum value. This will provide the lowest coupling impedance possible.

It can be advantageous to spit the capacitor arrangement into two, with one connected to neutral and the other to live, or the capacitor may be split further into multiple phases to provide a lower coupling impedance without increasing the touch current above the prescribed maximum level.

The invention may thus be implemented as a small protected circuit board with Y-capacitors, resistors and traces on it, fulfilling all requirements for creepage and clearances.

Figure 3:
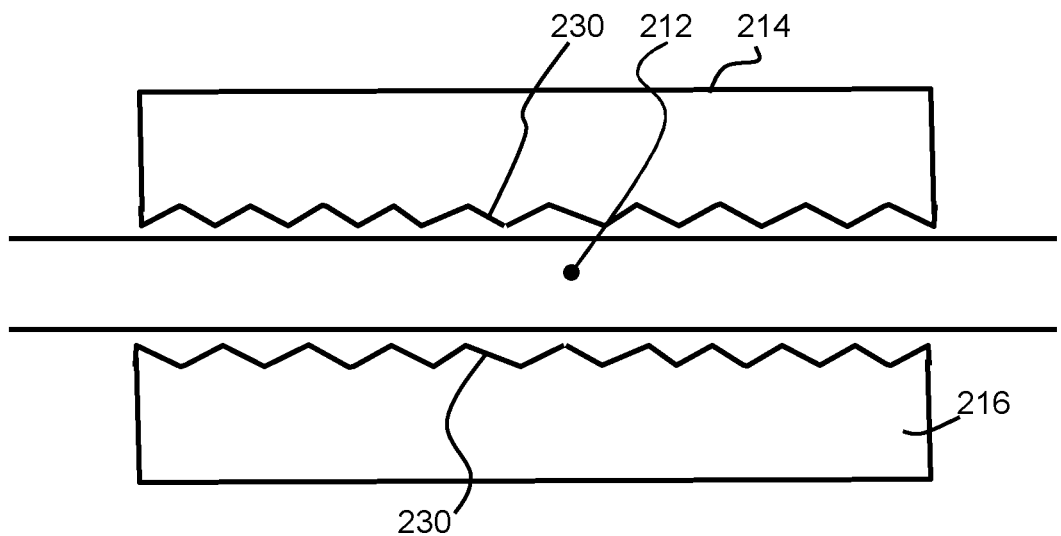
FIG. 3 shows that the contacts used in the PCB arrangement each comprise a toothed edge.

FIG. 3 shows that the contacts 214, 216 each comprise a toothed edge 230, with toothed edges facing each other across the arc gap 212. The second PCB and its gap is positioned between the external housing of the luminaire and the mains near the entrance of the mains to the luminaire.

Figure 4:
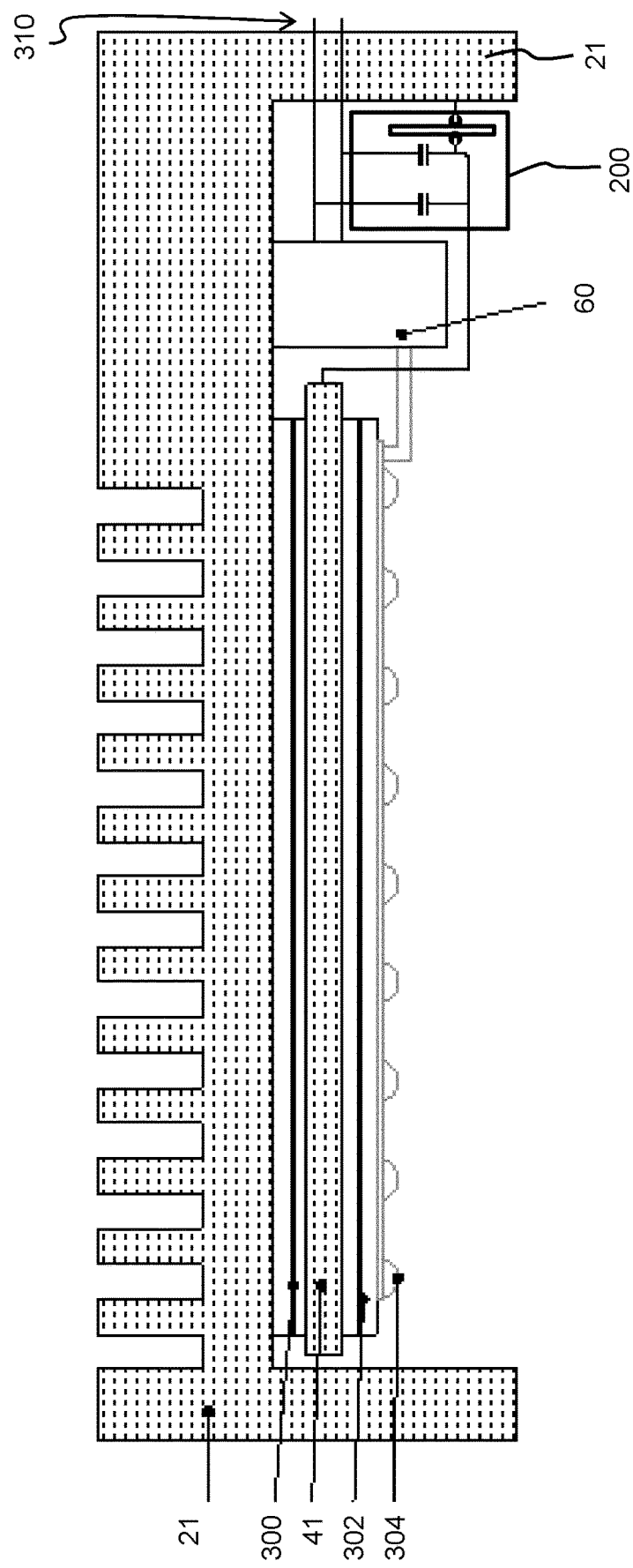
FIG. 4 shows the integration of the second PCB arrangement into a luminaire.

FIG. 4 shows the integration of the second PCB arrangement 200 into a luminaire. The design is similar to FIG. 1, and includes a conducting external housing 21 and a conductive screening layer 41. There is a first insulation layer 300 (reinforced or double insulation) above the conductive screening layer 41 and a second insulation layer 302 (optionally reinforced or double insulation) below the conductive screening layer 41.

The two insulation layers and the conductive screening layer may together form a first printed circuit board, i.e. a metal core printed circuit board. Alternatively, there may be in insulating PCB with a separate conductive screening layer.

The first insulation layer 300 is preferably designed to withstand at least 12 kV with a pulse form of 8/20 μs. It will be stressed to this level before a spark over will occur at the weakest spot.

The lighting circuit is generally shown 304 such as an LED PCB including electric interconnections and optionally other electronic and optical components.

The driver and other control components are shown as 60.

The power supply terminals are shown as 310 and they connect to the second PCB arrangement 200 as described above.

Figure 5:
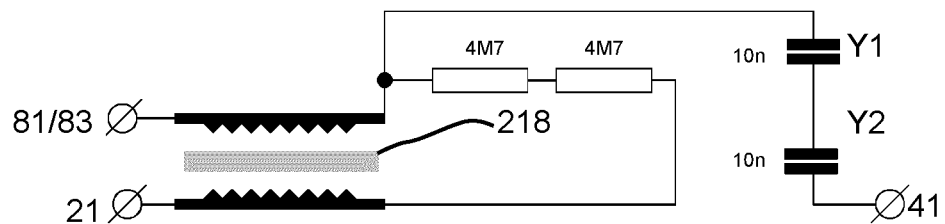
FIGS. 5 to 7 show some possible circuit arrangements for the bleeding resistors, Y-capacitors and arc gaps.
Figure 6:
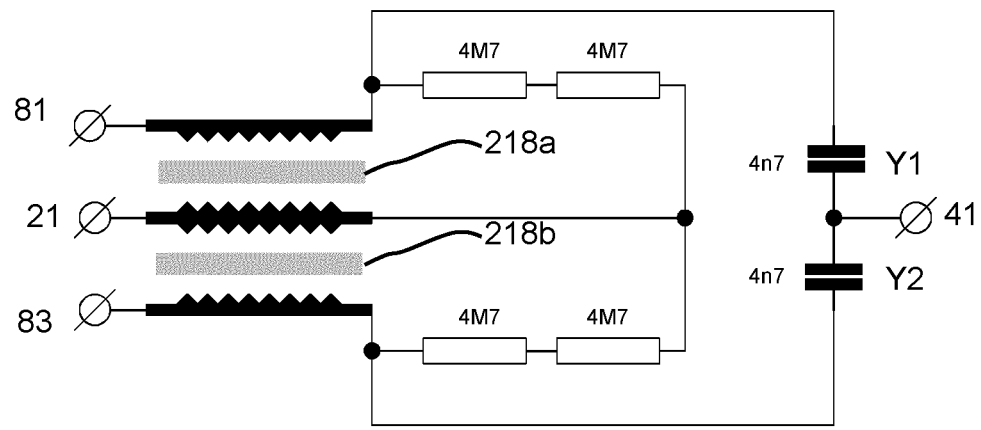
Figure 7:
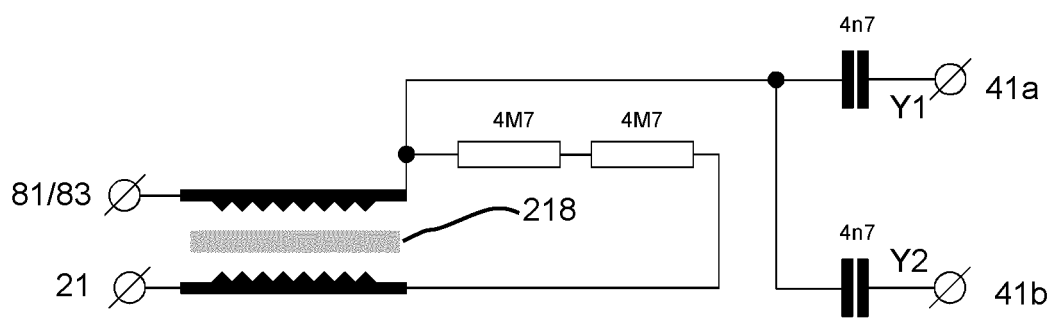

FIGS. 5 to 7 show some possible circuit arrangements for the bleeding resistors, Y-capacitors and arc gaps.

FIG. 5 shows a single slot 218 with contacts on opposite sides to the conductive portion 21 and to one of the live/neutral power supply terminals 81/83. There are two Y-capacitors Y1, Y2 in series between the power supply terminal 81/83 and the conductive screening layer 41. Two resistors in series are connected between the power supply terminal 81/83 and the conductive portion 21 of the exterior housing.

FIG. 6 shows two slots 218*a*, 218*b*. One has contacts on opposite sides to the conductive portion 21 and to one of the live/neutral power supply terminals 81 and the other has contacts on opposite sides to the conductive portion 21 and to the other of the live/neutral power supply terminals 83. The two Y-capacitors Y1, Y2 are in series between the two power supply terminals 81, 83, with the conductive screening layer 41 connected to the junction between them. A first two resistors are in series between one of the power supply terminals 81 and the conductive portion 21 of the exterior housing and a second two resistors are in series between the other of the power supply terminals 83 and the conductive portion 21.

FIG. 7 shows a single slot 218 with contacts on opposite sides to the conductive portion 21 and to one of the live/neutral power supply terminals 81/83. There is one Y-capacitor Y1 in series between the power supply terminal and a first conductive screening layer 41*a* and a second Y-capacitor Y2 in series between the power supply terminal and a second conductive screening layer 41b. Two resistors in series are connected between the power supply terminal 81/83 and the conductive portion 21 of the exterior housing.

The ideas can be extended to all three phases of a three phase supply. Furthermore, many different configuration are possible.

Figure 8:
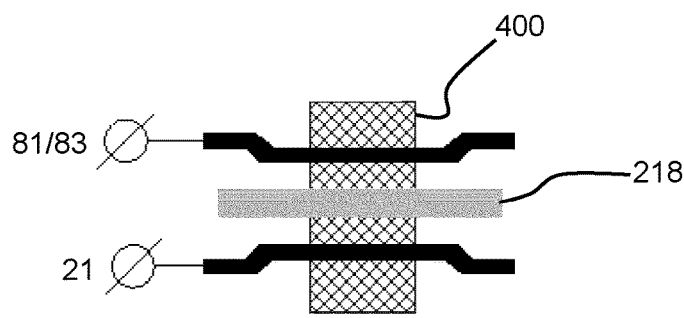
FIGS. 8 to 10 show various modifications in which the second printed circuit board has an insulated metal pad for electromagnetic field shaping. to assist the arc generation.
Figure 9:
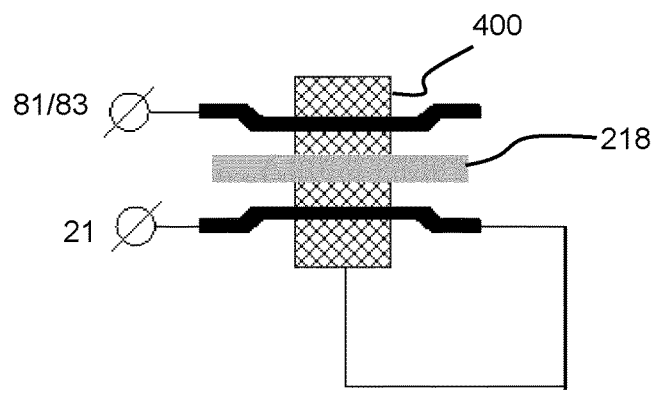
Figure 10:
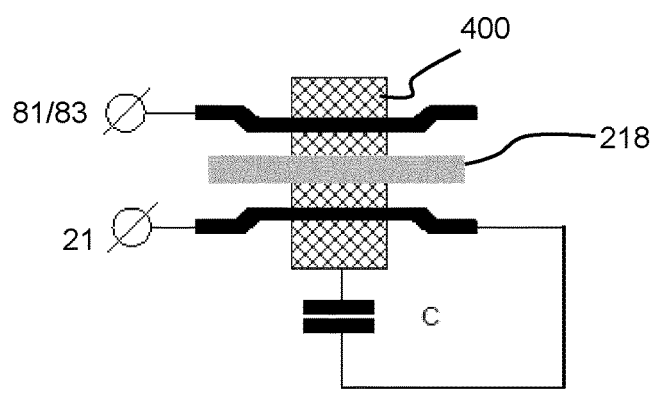

FIGS. 8 to 10 show a modification in which the second printed circuit board has an insulated metal pad 400 extending on opposite sides of the or each arc gap. This is used for electromagnetic field shaping to assist the arc generation.

FIG. 8 shows a single arc gap 218 with a pad 400 extending between the two contacts on opposite sides of the gap.

The pad functions as an enhancer, which has no adverse influence on the requirements for creepage and clearance. The pad is insulated completely. This means it has no bare surface in the vicinity of the traces or contacts, so that there is no direct flash over to the enhancer. The insulation material is capable of withstanding high voltages as required for double or reinforced insulation. It is also placed in such a way that metal vapor cannot deposit on it and form a bridge between traces.

The enhancer extends across at least two traces on opposite sides of the slot and across the slot itself. Thus, it is placed above the slot and in such a way it is strictly limited to the length of the slot to avoid spark over beside the slot. The slot is preferably longer than the width of the enhancer. However the enhancer can be significantly longer (in the direction perpendicular to the slot) than the distance between the outer edges of traces. The enhancer shapes the electric field strength by creating an additional stray capacitance between the traces. This makes spark over more easy for high frequency phenomena but not for mains frequency and its harmonics.

FIG. 8 shows an electrically floating pad 400, FIG. 9 shows a pad connected to the conductive portion of the external housing and FIG. 10 shows a pad connected to one side of a capacitor with the other side of the capacitor connected to the conductive portion of the external housing. Thus, the insulated metal pads may be electrically floating or electrically connected to the conductive portion of the external housing optionally through a series capacitor.

As explained above, one aspect of the invention is the capacitive coupling of the shielding conductor. This concept may be used independently of the discharge PCB concept. Thus, this concept provides an apparatus, such as a luminaire, comprising:

a housing;

a printed circuit board in the housing which carries a circuit, such as a lighting circuit;

a conductive screening layer attached to or integrated within the printed circuit board, wherein the conductive screening layer is insulated from the housing and from the circuit;

first and second power supply terminals; and a first Y-capacitor electrically between the conductive screening layer and one of the first and second power supply terminals.

The apparatus may then further comprise a second Y-capacitor electrically between the conductive screening layer and the other of the first and second power supply terminals.

The printed circuit board may comprise a metal core printed circuit board, the conductive screening layer comprises the metal core of the printed circuit board.

An insulator layer is then preferably provided between the printed circuit board and the housing.

When the apparatus is a luminaire, a driver will also be provided.

There may be a first insulator layer between the printed circuit board and the conductive screening layer and a second insulator the conductive screening layer and the housing.

The invention is generally relevant to lightening discharge, static charge, equipotential bonding and screening. It provides protection against static charge and provides an interconnection between a screen (which may be touchable) and the mains, in a safety compliant manner.

The invention has been described only in connection with luminaires.

By way of example, the invention may be applied to a street lighting pole which comprises the apparatus described above.

Figure 11:
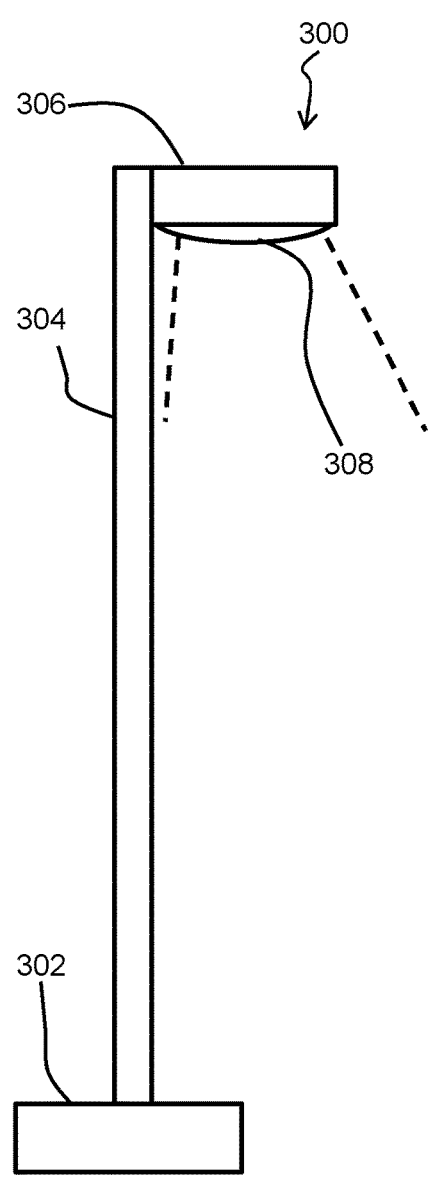
FIG. 11 shows a street light using a luminaire of the invention.

FIG. 11 shows a street light 300 comprising a base 302, a pole 304 and a lighting head 306. The lighting head 306 comprises an electrical apparatus as described above. Thus, the luminaire of FIG. 1 (modified in accordance with the invention to include the additional PCB) or the luminaire of FIG. 4 may form the lighting head 306 and form part a lighting head of a street light, or indeed form part of a street light.

The lighting head comprises optics to create a desired light distribution profile on the road surface and/or on a walkway. Typically, the distribution is asymmetrical so that it projects light away from the street light in the direction perpendicular to the road direction (i.e. across the road). This is shown schematically in FIG. 11 (which shows a view looking along the direction of the street). The optics comprise an optical arrangement which may be over the light exit aperture 24 as well as the lens plate 70 described above over the individual components of the light engine 45. The lighting head 306 may form a sealed enclosure to provide ingress protection, for example with a transparent covering 308 such as a globe over the light exit aperture.

The lighting head of a street is particularly vulnerable to lightning strikes, as the head is raised significantly above the ground. It also typically makes use of Class II luminaires, with no protective earth.

The invention may be applied more generally to other electrical apparatus, in particular outdoor electrical apparatus. Examples are weather stations, camera systems, remote sensors for all kinds of applications, and access control systems. The invention is of general interest for mains powered equipment without any protective earth conductor available. Furthermore, it is of particular interest for circuits which are to be mounted above the ground, like the lighting head of a street light, for example more than 3 m, for example more than 4 m or even more than 5 m above the ground. As a result, it is also of interest for circuits to be mounted on the tops of buildings, or trees or other high structures.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. If a computer program is discussed above, it may be stored/distributed on a suitable medium, such as an optical storage medium or a solid-state medium supplied together with or as part of other hardware, but may also be distributed in other forms, such as via the Internet or other wired or wireless telecommunication systems. If the term "adapted to" is used in the claims or description, it is noted the term "adapted to" is intended to be equivalent to the term "configured to". Any reference signs in the claims should not be construed as limiting the scope.

The invention claimed is:

1. An electrical apparatus comprising:
   an external housing including an electrically conductive portion;
   at least first and second power supply terminals for connection to an external source of power;
   a first printed circuit board in the external housing which carries a circuit;
   an electrically conductive screening layer attached to or integrated within the first printed circuit board, wherein the conductive screening layer is insulated from the external housing and from the circuit;
   a second printed circuit board, separate to the first printed circuit board;
   a PCB housing around the second printed circuit board and within the external housing, wherein:
   the second printed circuit board is mechanically connected to the external housing and electrically coupled to the electrically conductive portion of the external housing;
   the second printed circuit board comprises an arc gap between a first contact which connects electrically to the electrically conductive portion of the external housing and a second contact which connects electrically to one of the first and second power supply terminals.

2. An apparatus as claimed in claim 1, wherein the second printed circuit board comprises a slot, with the first and second contacts on opposing sides of the slot.

3. An apparatus as claimed in claim 1, wherein the second printed circuit board comprises a second arc gap between the first contact and a third contact which connects electrically to the other of the first and second power supply terminals.

4. An apparatus as claimed in claim 3, wherein the second printed circuit board comprises a second slot, with the first and third contacts on opposing sides of the second slot.

5. An apparatus as claimed in claim 1, wherein the contacts each comprise a toothed edge, wherein toothed edges face each other across a slot.

6. An apparatus as claimed in claim 1, wherein the first printed circuit board comprises a metal core printed circuit board, and the electrically conductive screening layer comprises the metal core of the printed circuit board.

7. An apparatus as claimed in claim 1, wherein the second printed circuit board further comprises a first arrangement of one or more bleeder resistors connected between the electrically conductive portion of the external housing and one of the first and second power supply terminals.

8. An apparatus as claimed in claim 7, wherein the second printed circuit board further comprises a second arrangement of one or more bleeder resistors connected between the electrically conductive portion of the external housing and the other of the first and second power supply terminals.

9. An apparatus as claimed in claim 1, wherein the second printed circuit board carries a first Y-capacitor electrically between the conductive screening layer and one of the first and second power supply terminals.

10. An apparatus as claimed in claim 9, wherein the second printed circuit board further carries a second Y-capacitor electrically between the conductive screening layer and the other of the first and second power supply terminals.

11. An apparatus as claimed in claim 1, wherein the second printed circuit board further comprise an insulated metal pad extending on opposite sides of the or each arc gap.

12. An apparatus as claimed in claim 11, wherein each insulated metal pad is electrically floating or electrically connected to the electrically conductive portion of the external housing or connected to the electrically conductive portion of the external housing through a capacitor.

13. An apparatus as claimed in claim 1, wherein the PCB housing provides double or reinforced insulation.

14. An apparatus as claimed in claim 1, wherein the apparatus comprises a luminaire, and the circuit comprises a light source circuit.

15. An apparatus as claimed in claim 14, further comprising a lighting driver in the external housing, which is separate to the first and second printed circuit boards.

* * * * *